(12) United States Patent
Koudar

(10) Patent No.: US 8,645,580 B2
(45) Date of Patent: Feb. 4, 2014

(54) CIRCUIT AND ELECTRONIC MODULE FOR AUTOMATIC ADDRESSING

(75) Inventor: Ivan Koudar, Modrice (CZ)

(73) Assignee: Semiconductor Components Industries, LLC, Phoenix, AZ (US)

(*) Notice: Subject to any disclaimer, the term of this patent is extended or adjusted under 35 U.S.C. 154(b) by 210 days.

(21) Appl. No.: 13/226,025

(22) Filed: Sep. 6, 2011

(65) Prior Publication Data

US 2013/0057339 A1 Mar. 7, 2013

(51) Int. Cl.
*G06F 3/00* (2006.01)
(52) U.S. Cl.
USPC .................................. 710/3; 710/9
(58) Field of Classification Search
None
See application file for complete search history.

(56) References Cited

U.S. PATENT DOCUMENTS

| | | | |
|---|---|---|---|
| 6,611,774 | B1 | 8/2003 | Zaccaria |
| 7,092,829 | B2 | 8/2006 | Kato et al. |
| 7,373,224 | B2 | 5/2008 | Goetz et al. |
| 7,660,437 | B2 | 2/2010 | Breed |
| 8,122,159 | B2* | 2/2012 | Monreal ............... 710/9 |
| 2009/0144471 | A1 | 6/2009 | Lin |
| 2010/0185784 | A1* | 7/2010 | De Nie et al. ............ 710/9 |

FOREIGN PATENT DOCUMENTS

| | | |
|---|---|---|
| DE | 37 36 081 A1 | 5/1989 |
| DE | 10 2007 036888 B3 | 3/2009 |
| WO | WO 2009/013674 | 1/2009 |

OTHER PUBLICATIONS

LIN Consortium; "LIN Specification Package, Revision 2.2"; Dec. 31, 2010; pp. 1-194; LIN Administration, c/o Altran GmbH & Co. KG, Bernhard-Wicki-StraBe 3, D-80636, Munchen, Germany; www.lin-subbus.org.
ELMOS Semiconductor AG; "Auto Addressing"; Web Page; 1 Page; http://www.elmos.de_english_products_know-how_auto-addressing.html; 2011; ELMOS Semiconductor AG, Heinrich-Hertz-Str. 1, 44227 Dortmund, Germany 0231 7549-0.

* cited by examiner

*Primary Examiner* — Idriss N Alrobaye
*Assistant Examiner* — Richard B Franklin
(74) *Attorney, Agent, or Firm* — Paul J. Polansky

(57) ABSTRACT

An integrated circuit includes a first configuration terminal, a second configuration terminal, a bus terminal, and an auto addressing circuit coupled to the first and second configuration terminals. The auto addressing circuit is responsive to a data pattern received at the first configuration terminal to assign a node address to an operational circuit, and subsequently to couple the first configuration terminal to the second configuration terminal. The integrated circuit is subsequently responsive to the node address when the node address is received.

19 Claims, 6 Drawing Sheets

CIRCUIT AND ELECTRONIC MODULE FOR AUTOMATIC ADDRESSING

FIELD

The present disclosure is generally related to monitoring and control systems, and more particularly, to monitoring and control systems having multiple electronic modules and an electronic control unit (ECU) that are connected through a common bus.

BACKGROUND

In complex systems, such as automobiles, multiple modules can be used to monitor and/or control various operating parameters and to communicate data related to those operating parameters to an ECU, which may control various components and provide outputs to a dashboard or display. Conventionally, such modules can be connected using a hub-and-spoke or star-type connection scheme where the ECU is connected to each module through a dedicated line or bus. Unfortunately, the sensor wiring adds to the wiring complexity and overall cost of the system. Further, each dedicated line or bus represents at least two potential failure points where the line is connected to the ECU and where the line is connected to the module.

Alternatively, each of the modules can be connected to the ECU through a common bus. Examples of such an architecture include the Controller-Area Network (CAN)-bus, which is a vehicle bus standard designed to allow microcontrollers and devices to communicate with each other within a vehicle without a host computer. CAN-bus defines a message-based protocol (designed specifically for automotive applications but now also used in other areas such as industrial automation and medical equipment) that is sent via differential signals. Another example includes the Local Interconnect Network (LIN)-bus, which is a vehicle bus standard or computer networking bus-system used within current automotive network architectures that uses single-ended communications. The LIN-bus is a small and slow network system that is used as a cheap sub-network of a CAN-bus to integrate intelligent sensor devices or actuators. While common bus architectures, such as CAN-bus or LIN-bus, are typically more reliable than hub-and-spoke or star-type topologies because they have fewer failure points, each module needs to be assigned a unique address for the common bus to operate.

BRIEF DESCRIPTION OF THE DRAWINGS

In the following discussion, the same reference numerals are reused within the figures to indicate the same or similar elements.

DETAILED DESCRIPTION OF ILLUSTRATIVE EMBODIMENTS

Embodiments of a system are described below that include a plurality of modules coupled to a common bus and interconnected in a daisy chain configuration. The modules can include sensor modules, actuator modules, or other types of electrical modules. Each module includes an automatic addressing circuit configured to assign an address to the module in response to a node address signal from an ECU or from another module in the daisy chain. Each module further includes a bypass resistor configured to provide a bypass signal path, which allows the module to provide a received signal to a next module in the daisy chain, even when the automatic addressing circuit fails. An example of a system including a plurality of modules is described below with respect to FIG. 1.

Figure 1:
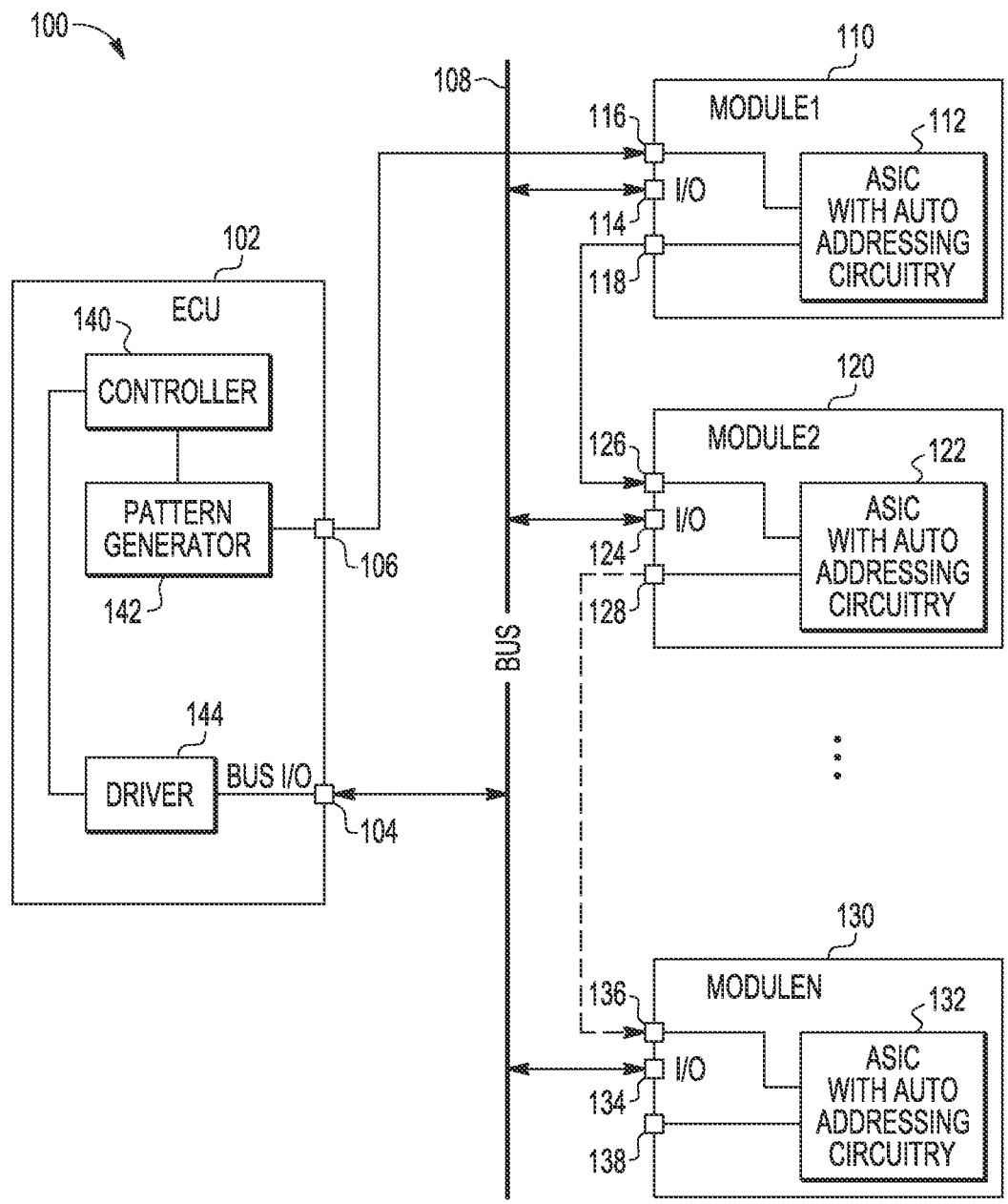
FIG. 1 is a block diagram of a system including an electronic control unit (ECU) connected to a plurality of modules through a common bus.

FIG. 1 is a block diagram of a system 100 including an electronic control unit (ECU) 102 connected to a plurality of modules 110, 120, and 130 through a common bus 108. While the illustrated example depicts three modules 110, 120, and 130, system 100 can include any number of modules connected to common bus 108 and to each other through a daisy chain. In some instances, the number of modules may be physically restricted by the bus type.

ECU 102 includes a bus input/output (I/O) terminal 104 and a module output terminal 106. ECU 102 further includes a controller 140 connected to a pattern generator 142, which has an output connected to module output terminal 106. ECU 102 further includes a driver circuit 144 having an input connected to controller 140 and an output connected to bus I/O terminal 104.

Each module 110, 120, and 130 includes an input terminal 116, 126, and 136, respectively. Each module 110, 120, and 130 further includes an output terminal 118, 128, and 138, respectively. Further, each module 110, 120, and 130 includes a bus I/O terminal 114, 124, and 134, respectively. Additionally, each module 110, 120, and 130 includes an application-specific integrated circuit (ASIC) 112, 122, and 132, respectively, which circuits include auto-addressing circuitry. ASICs 112, 122, and 132 include various circuits (not shown), such as auto addressing blocks, bus control blocks, registers, and other circuits, and the auto addressing circuitry is one such circuit.

Module 110 includes bus I/O terminal 114 connected to common bus 108, input terminal 116 connected to module output terminal 106, and output terminal 118 connected to input terminal 126 of module 120. Module 110 includes ASIC 112 including automatic address assignment circuitry and having an input connected to input terminal 116 and an output connected to output terminal 118. ASIC 112 may also include an input coupled to bus I/O terminal 114.

Module 120 includes a bus I/O terminal 124 connected to common bus 108 and output terminal 128 connected to input terminal 138 of module 130. Module 120 includes ASIC 122 including automatic addressing circuitry and having an input connected to input terminal 126 and an output connected to output terminal 128. ASIC 122 may also include an input coupled to bus I/O terminal 124.

Module 130 includes a bus I/O terminal 134 connected to common bus 108 and output terminal 138, which, in this example, is left floating; however, the output terminal 138 could be connected to a next module in the daisy chain. Module 130 includes ASIC 132 including automatic addressing circuitry and having an input connected to input terminal 136 and an output connected to output terminal 138. ASIC 132 may also include an input coupled to bus I/O terminal 134.

In an example, after a "power on" event where power is first supplied to system 100, modules 110, 120, and 130 either have no node addresses or have a special "broadcast" address that is the same for all of them. In this state, ECU 102 cannot communicate with a specific module through common bus 108. However, system 100 includes a dedicated auto addressing line that connects module output terminal 106 to input terminal 108 of module 110, which is the first module in a daisy chain. System 100 uses the dedicated auto addressing line in combination with ASICs 112, 122, and 132 to assign addresses to each module 110, 120, and 130, making it possible for the ECU 102 to subsequently communicate with a specific module.

In an example, ECU 102 uses the dedicated line to provide an encoded pattern to condition each of the modules 110, 120, and 130 to receive a node address assignment. Depending on the operating mode, ECU 102 may either encode the node address assignment into the encoded pattern to deliver the node address assignment (bus passive mode) or use common bus 108 to deliver the node address assignment to each of the modules 110, 120, and 130 after using the encoded pattern to condition the selected module (bus active mode). In either case, controller 140 controls pattern generator 142 to generate and apply an encoded bit pattern to module output terminal 106, which pattern is received at input terminal 116 of module 110.

In a bus active mode, ECU 102 controls the common bus 108 to manage the node address assignment flow while the daisy chain configuration of modules 110, 120, and 130 supports reliable, sequential address assignment. In this example, after power on, all modules 110, 120, and 130 have default broadcast addresses. Controller 140 of ECU 102 controls pattern generator 142 to provide a bit pattern to input terminal 116 of module 110 through module output terminal 106. ASIC 112 includes automatic addressing circuitry to decode the bit pattern. After a period of time, controller 140 controls driver 144 to provide a node address assignment command to the common bus 108 using the default broadcast address. The decoding of the bit pattern conditions module 110 to accept and assign the node address in response to the node address assignment command received at bus I/O terminal 114. Once the node address is assigned to module 110, automatic addressing circuitry of ASIC 112 propagates the pattern to module 120, which is the next module in the daisy chain, and the controller 140 once again controls driver 144 to provide a new node address assignment command to the common bus 108 using the default broadcast address. The propagation of the bit pattern through the daisy chain and the address assignment via the common bus 108 are repeated until each of the modules 110, 120, and 130 have been assigned addresses.

In a passive bus mode, ECU 102 does not use the common bus 108 to assign the node addresses. Instead, controller 140 controls pattern generator 142 to generate a bit sequence that codes the first node address and to provide the bit sequence to module 110. In this instance, ASIC 112 includes automatic addressing circuitry to decode the bit sequence to extract the first node address and provides the node address to a control circuit or bus communication circuit of module 110. Once ASIC 112 has completed the node address assignment, the automatic addressing circuitry of ASIC 112 regenerates the bit sequence with a new node address and provides the regenerated sequence to module 120. This process is repeated until each of the modules 110, 120, and 130 has an assigned node address. In this example, the new node address may be generated by adjusting the first node address by a pre-determined increment or can be managed arbitrarily.

In an example, the specific bit pattern produced by pattern generator 142 can be designed for high robustness against disturbances (namely electromagnetic interference). An example of an embodiment of a module the associated ASIC topology configured to perform automatic addressing is described below with respect to FIG. 2.

Figure 2:
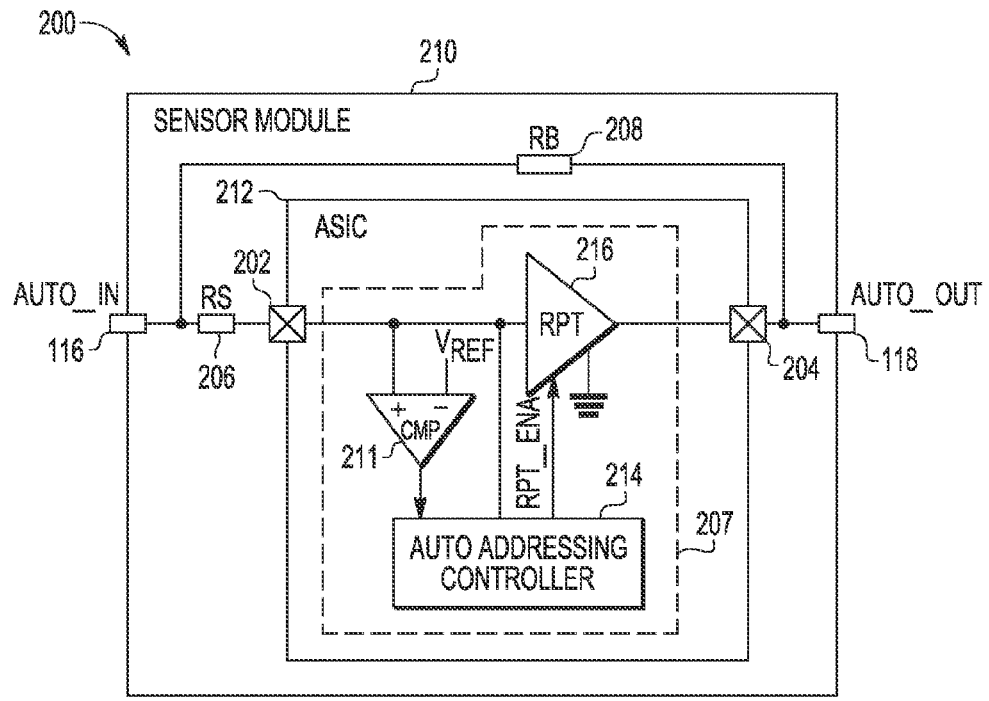
FIG. 2 is a partial block diagram and partial circuit diagram of an embodiment of a sensor module that includes, among other circuitry, auto-addressing electronics, such as one of the plurality of modules of FIG. 1.

FIG. 2 is a partial block diagram and partial circuit diagram 200 of an embodiment of a sensor module 210, such as one of the plurality of modules of FIG. 1. Sensor module 210 includes input terminal 116 and output terminal 118. Sensor module 210 further includes a bypass resistor 208 including a first terminal connected to input terminal 116 and a second terminal connected to output terminal 118. Sensor module 210 further includes a resistor 206 including a first terminal connected to input terminal 116 and a second terminal connected to an input terminal 202 of ASIC 212, which has an output terminal 204 connected to output terminal 118. ASIC 212 includes an automatic addressing circuit 207. ASIC 212 may also include an I/O terminal (not shown) for providing decoded data to a control circuit or bus communication circuit of module 210.

Automatic addressing circuit 207 includes a comparator 211 including a first input connected to input terminal 202, a second input for receiving a reference voltage ($V_{REF}$), and an output. Automatic addressing circuit 207 further includes a repeater 216 having an input connected to input terminal 202, a control input, and an output connected to output terminal 204. Additionally, automatic addressing circuit 207 also includes an auto addressing controller 214 having an input connected to the output of comparator 211 and an output connected to the control input of repeater 216.

In an example, after power on, module 210 receives a bit pattern at input terminal 116. If ASIC 212 fails, bypass resistor 208 provides an alternative signal path to the output terminal 118. If the next module is connected in the daisy chain, the signal level on its input 116 is attenuated to a half level, because its switch 304 (in FIG. 3) is turned on. Thus, in the event of failure of the ASIC 212, node addressing can proceed.

After power on, auto addressing controller 214 turns off repeater 216, switches SWL 304 and SWT 302 are ON and OFF, respectively, pending assignment of the node address to module 210. If ASIC 212 is operating correctly, comparator 211 decodes the bit pattern and provides a comparator output signal to auto addressing controller 214. Auto addressing controller 214 either recovers the node address from the bit pattern and assigns the node address or conditions a control circuit or bus communication circuit of module 210 to receive a node address assignment command from common bus 108, depending on the operating mode.

Once the node address is assigned, auto addressing controller 214 activates switches SWL 304 and SWT 302 to be OFF and ON, respectively, and enables repeater 216 to provide the bit pattern to output terminal 204. In particular, auto addressing controller 214 controls repeater 216 to selectively amplify the signal including the bit pattern. In an instance where an immediately preceding module in the daisy chain experiences a failure of its ASIC 212, repeater 216 operates to restore the signal including the bit sequence to level that is substantially the same as the signal originally provided by ECU 102, making it possible to assign node addresses to the modules even when some of the modules in the daisy chain experience failures.

In addition to selectively enabling repeater 216, it may be desirable to use switches to disconnect the repeater and to disable the bypass resistor 208 during the addressing process. The switch 304 at the output of repeater 216 should be connected to ground until the repeater 216 is enabled. The illustrated example of FIG. 2 represents one possible implementation of the circuit. An expanded example of the embodiment of FIG. 2 is described below with respect to FIG. 3, which shows switches for disconnecting the repeater 216 and connecting an output of the repeater 216 to ground.

Figure 3:
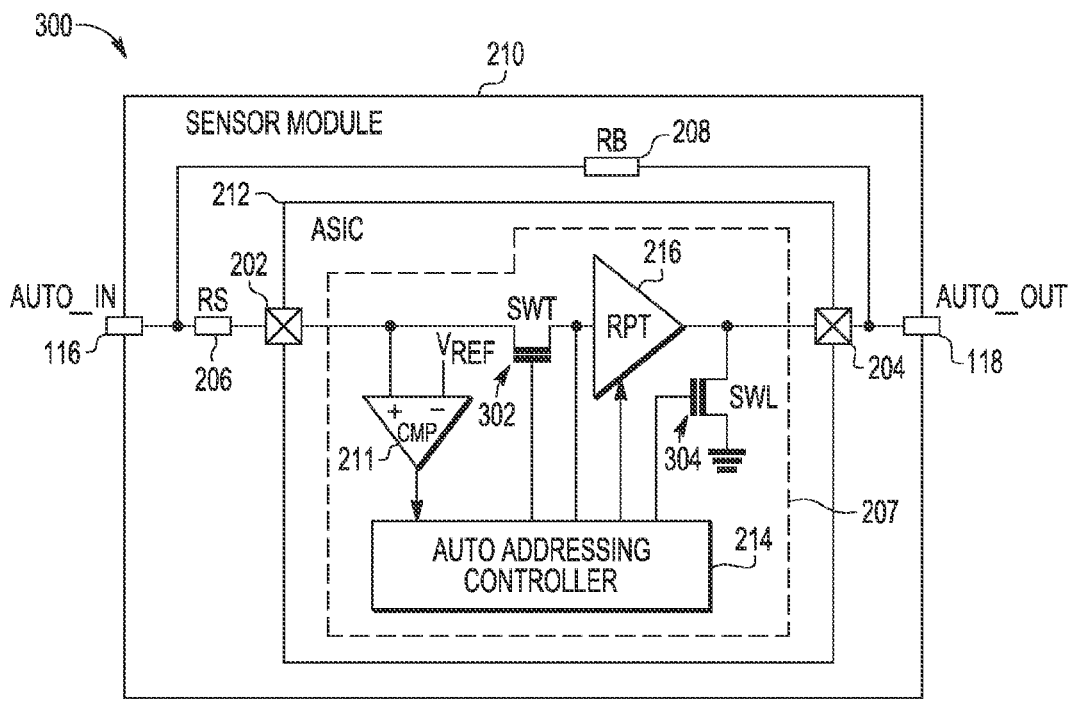
FIG. 3 is a partial block diagram and partial circuit diagram of an expanded view of the auto-addressing electronics of FIG. 2 depicting switches that may be implemented within a repeater of the auto-addressing electronics.

FIG. 3 is a partial block diagram and partial circuit diagram 300 of an expanded view of the automatic addressing circuit 207 of FIG. 2 depicting switches 302 and 304, which are implemented within repeater 216. Sensor module 210 is the same as sensor module 210 in FIG. 2 with two switches 302 and 304, which are typically embedded within repeater 216, but which are depicted here as metal oxide semiconductor field effect transistors (MOSFETs) for discussion purposes. Switch 302 includes a first current electrode connected to input terminal 202, a control electrode connected to auto addressing controller 214, and a second current electrode connected to the input of repeater 216. Switch 304 includes a first current electrode connected to output terminal 204, a control terminal connected to auto addressing controller 214, and a second current electrode connected to ground.

In an example, in the bus active mode, auto addressing controller 214 disables repeater 216, biases switch 302 in an off state, and biases switch 304 to connect output terminal 204 to ground. When a bit pattern is received at input terminal 116, the pattern is provided to input terminal 202 through resistor 206 and provided to ground through bypass resistor 208 and switch 304. By grounding output terminals 204 and 118, the bit pattern is effectively stopped at the module 210 while the auto addressing circuit 207 processes the bit pattern using comparator 211 and auto addressing controller 214. During this period, auto addressing circuit 207 decodes the bit pattern. The decoded bit pattern is then used either to program a node address for a control circuit or bus communication circuit of module 210 based on an encoded node address within the bit pattern or to condition the control circuit or bus communication circuit to receive a node address from common bus 108. Once the node address is programmed, turns off switch 304, biases switch 302 to turn on, and enables repeater 216 to propagate the bit pattern to the next module in the daisy chain. This process is repeated until a node address has been assigned to the last module in the daisy chain.

In a passive mode, auto addressing controller 214 disables repeater 216, turns off switch 302 and activates switch 304. Upon receipt of the bit pattern including an encoded node address at input terminal 202, comparator 211 decodes the bit pattern to recover the node address and programs the control circuit or bus communication circuit of module 210 with the node address data. Auto addressing controller 214 re-generates the bit pattern including a new node address, and provides the bit pattern with the new node address to repeater 216, which sends out the regenerated sequence to output terminal 204. In this instance, a next module in the daisy chain can operate on the bit pattern to recover the new node address and so on, until addresses have been assigned to each of the modules. In an alternative embodiment, a driver circuit may be included either within or external to auto addressing controller 214 to drive a new bit pattern to the output terminal 204 (either through repeater 216 or directly onto the output of repeater 216).

While the above-described examples in FIGS. 2 and 3 provide bypass resistor 208 for bypassing a failed ASIC to provide the bit sequence to a next module in the daisy chain, it may be desirable to identify the failure points within the daisy chain. An example of auto addressing circuit including an additional comparator and a bit register for identifying the failed ASIC is described below with respect to FIG. 4.

Figure 4:
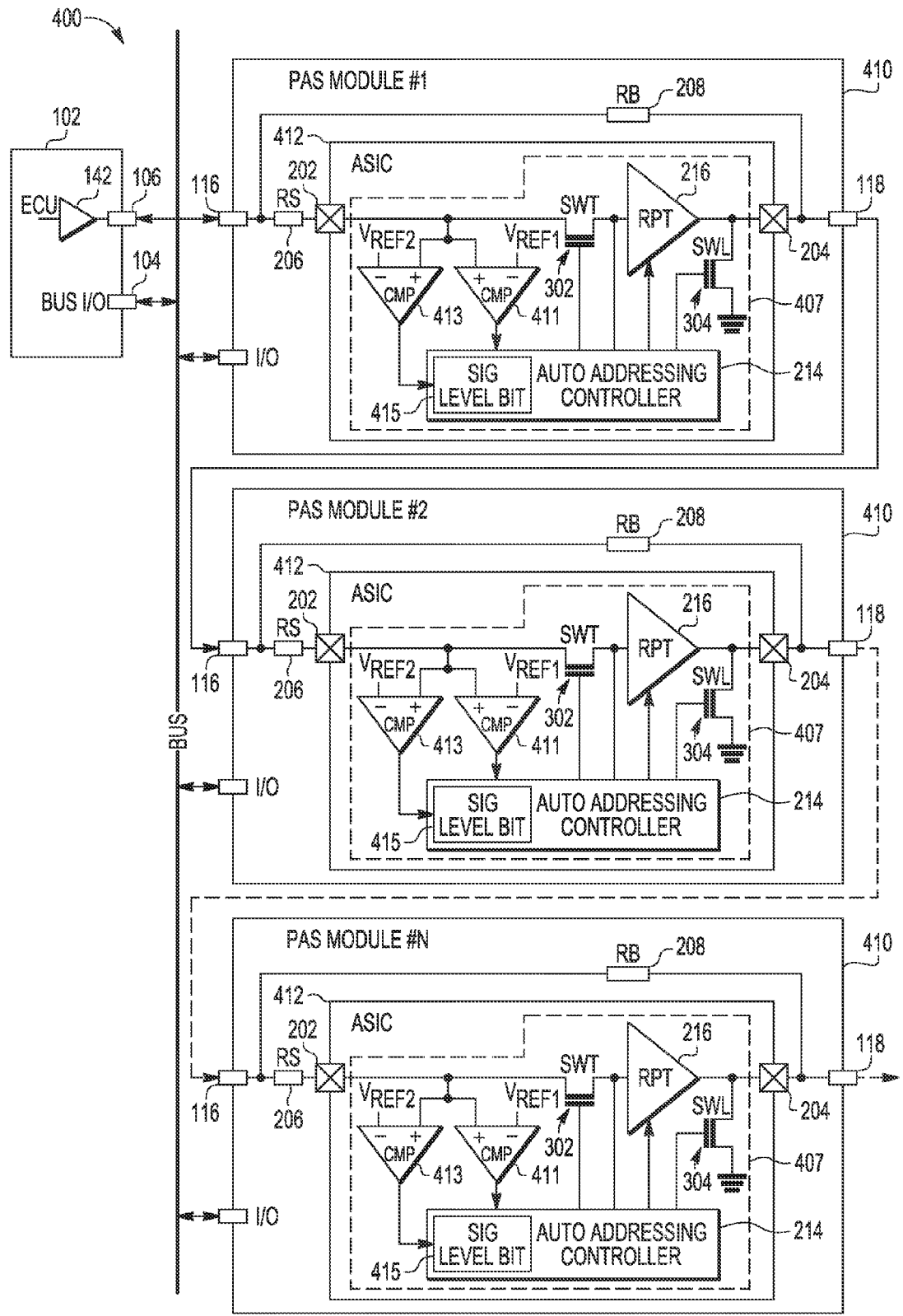
FIG. 4 is partial block diagram and partial circuit diagram of an embodiment of the system of FIG. 1, implemented using a second embodiment of a sensor module that includes, among other circuitry, auto-addressing electronics.

FIG. 4 is partial block diagram and partial circuit diagram 400 of an embodiment of the system 100 of FIG. 1, implemented using a second embodiment of a sensor module 410, such as one of the plurality of modules of FIG. 1. In this example, modules 410 have all of the circuit elements of module 210 in FIG. 3 and include comparator circuitry and a register. In the illustrated example, each module 410 includes an ASIC 412 including auto addressing circuit 407 having comparators 411 and 413. Comparator 411 includes a positive input connected to input terminal 202, a negative input connected to a first reference ($V_{REF1}$) and an output connected to auto addressing controller 214. Comparator 413 includes a positive input connected to input terminal 202, a negative input connected to a second reference ($V_{REF2}$), and an output connected to storage register 415 for storing a signal level bit.

In this instance, comparator 411 can be used to decode the bit sequence, and comparator 413 can be used to detect the amplitude of the bit sequence. If, in an example, the bit sequence is attenuated by the bypass resistor 208 of the previous module in the daisy chain, comparator 411 can still decode the bit sequence while comparator 413 determines that the previous module 410 had a failed ASIC 412. In this example, repeater 216 restores the bit sequence to original signal strength, while bypass resistor 208 attenuates the bit sequence to a level that can be approximately half of the original signal strength. Thus, comparator 413 can detect when the received bit sequence is delivered through the bypass path based on the signal level, thereby detecting a failed ASIC 412 in the daisy chain.

As discussed above, during a bus active mode, ECU 102 controls the address assignment flow by applying the bit sequence and then providing the node address to the common bus. A representative example of the signal timing for assigning addresses to the modules of FIG. 4 using a bus active mode is described below with respect to FIG. 5.

Figure 5:
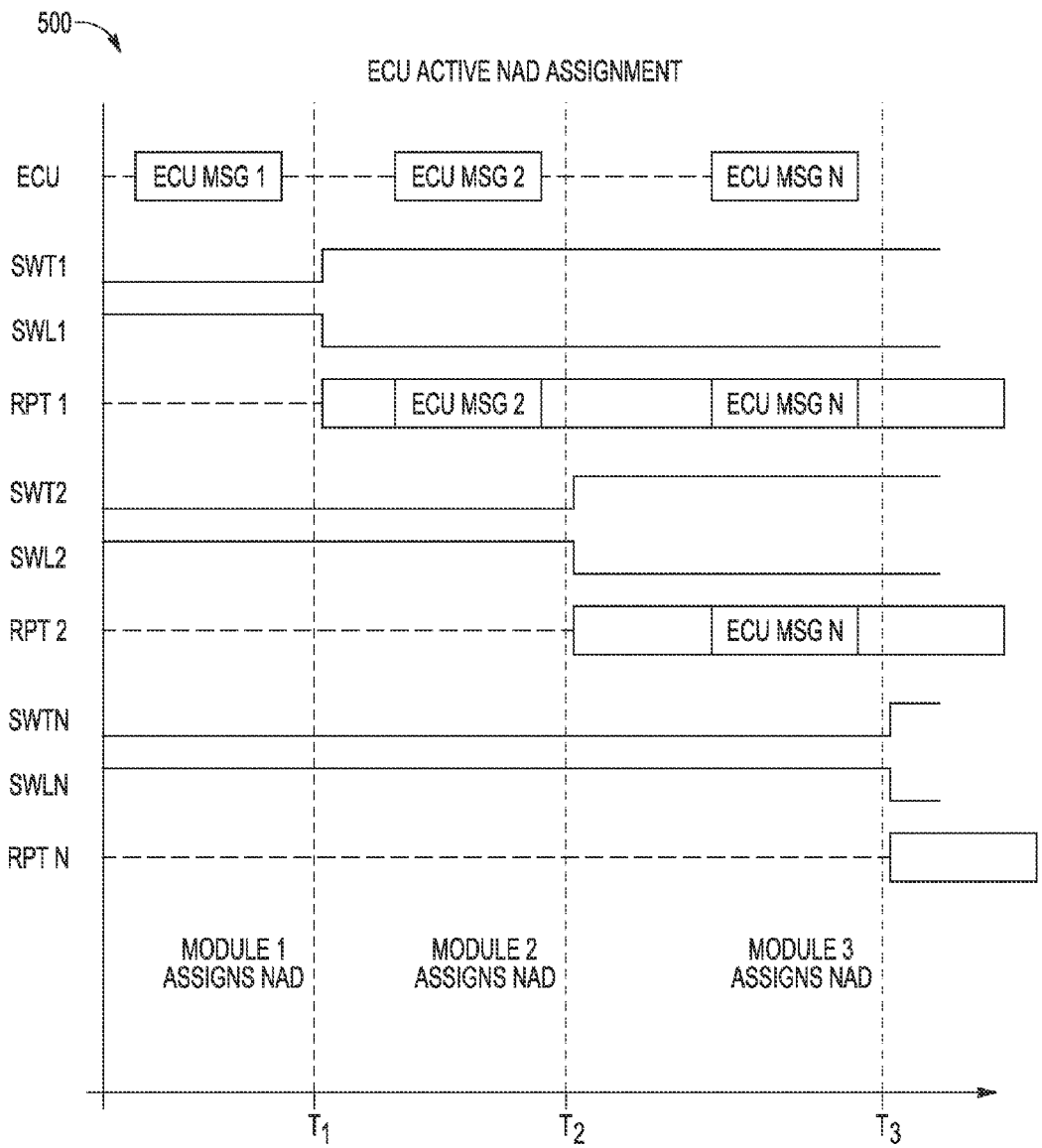
FIG. 5 is a timing diagram of signals for assigning node addresses to the plurality of modules using an active bus mode.

FIG. 5 is a timing diagram 500 of signals for assigning node addresses to the plurality of modules using an active bus mode. Diagram 500 depicts messages (or bit sequences) transmitted by ECU 102 during a first period of time up to a first time ($T_1$), during a second period of time up to second time ($T_2$) and during a third period of time up to a third time ($T_3$). During the first period of time, the control signal at the control terminal of switch 302 in FIG. 3 is at a logic low level, turning off switch 302. At the same time, the control signal at the control terminal of switch 304 is at a logic high level, connecting output terminal 204 to ground, and repeater 216 is turned off. During the first period of time, ECU 102 transmits a first message ("ECU MSG 1") which includes a bit pattern for decoding by auto addressing block 207 (or 407) of ASIC 212 (or 412) to condition the module 410 for receiving the node address from the common bus 108.

After the first period of time during which the node address is assigned by ECU 102 via common bus 108 using a broadcast message that includes the node address assignment command, the control signal at the control terminal of switch 302 transitions to a logic high level to bias switch 302 to conduct current, and the control signal at the control terminal of switch 304 transitions to a logic low level to turn off switch 304. Further, the repeater is enabled. During this second period of time, at a next module in the daisy chain, the switch 302 is off, the repeater 216 is disabled, and the switch 304 is turned on. At some point during this second period of time, ECU 102 sends a second message ("ECU MSG 2"), which includes a bit pattern. Repeater 216 of the already addressed module transmits the second message to output terminal 204 and to the next module in the daisy chain for decoding by the auto addressing circuit 207 (or 407) of ASIC 212 (or 412) of the next module. At this point the switch 302 and the repeater 216 of each of the subsequent modules in the daisy chain are turned off, and the switch 304 of each of the subsequent modules in the daisy chain is connected to ground. During this second period of time, ECU 102 broadcasts a node assignment command on common bus 108, addressing the second module.

After the second module is addressed, the control signal at the control terminal of switch 302 of the second module transitions to a logic high level, biasing switch 302 to conduct current. Further, repeater 216 of the second module is enabled, and the control signal on the control terminal of switch 304 transitions to a logic low level, turning off switch 304 and allowing the output of repeater 216 to reach the output terminal 204 for transmission to a next module in the sequence. After the second period of time during which the second module receives its node address, ECU 102 transmits an N-th bit sequence ("ECU MSG N"), which is forwarded by repeaters 216 of the first and second modules 410 to the N-th module 410. ECU 102. The timing process can repeat for any number of modules, limited only by the physical constraints of the bus.

Figure 6:
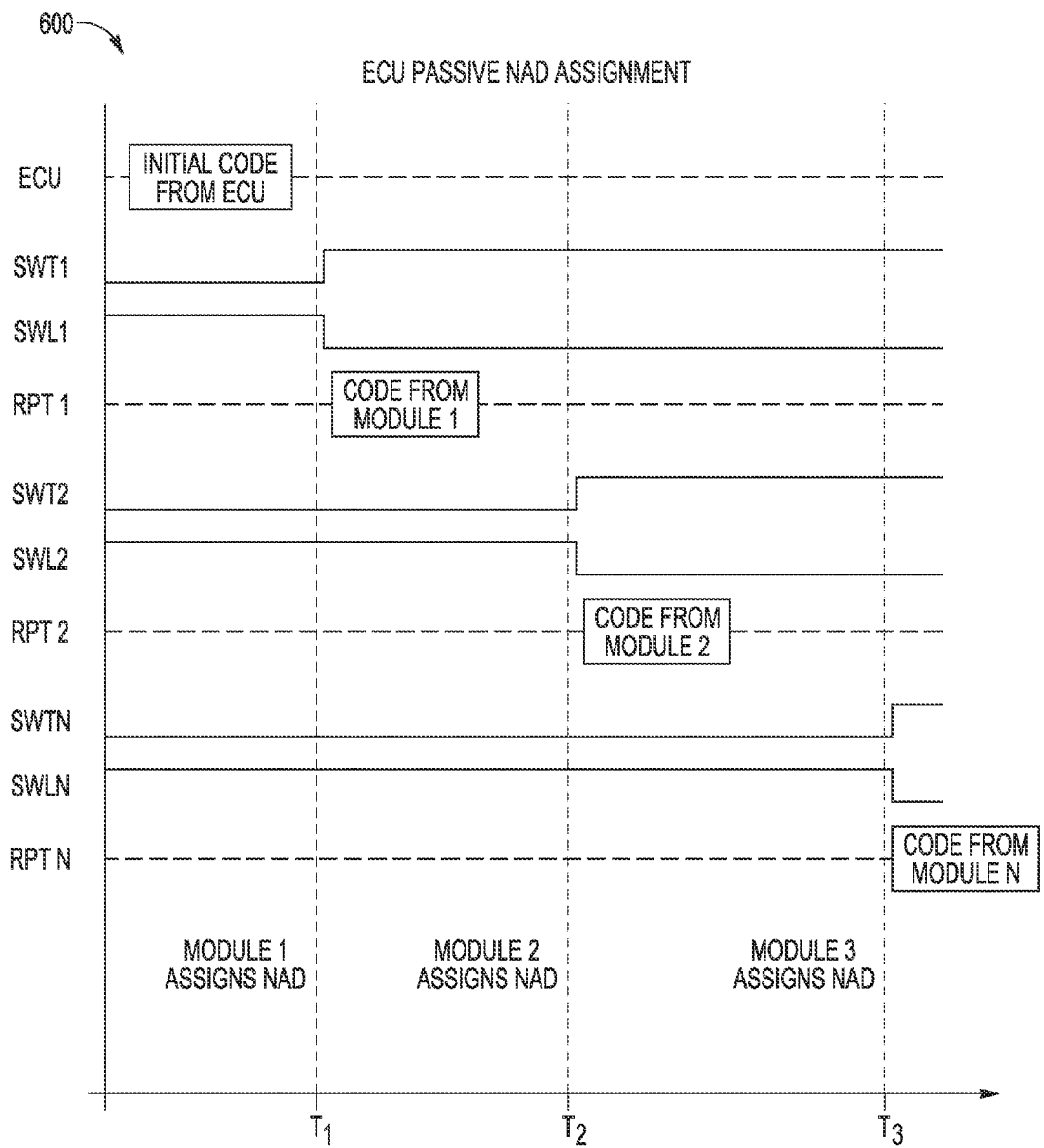
FIG. 6 is a timing diagram of signals for assigning node addresses to the plurality of modules using a passive bus mode.

FIG. 6 is a timing diagram 600 of signals for assigning node addresses to the plurality of modules using a passive bus mode. Diagram 600 depicts messages (or bit sequences) transmitted by ECU 102 during a first period of time up to a first time ($T_1$), during a second period of time up to second time ($T_2$) and during a third period of time up to a third time ($T_3$). During the first period of time, the control signal at the control terminal of switch 302 in FIG. 3 is at a logic low level, turning off switch 302. At the same time, the control signal at the control terminal of switch 304 is at a logic high level, connecting output terminal 204 to ground, and repeater 216 is turned off. During the first period of time, ECU 102 transmits a first message ("ECU MSG 1") which includes a bit pattern including an encoded node address for the first module 410. Auto addressing circuit 207 (or 407) of ASIC 212 (or 412) decodes the bit pattern to recover the encoded node address for the first module and assigns the node address to the control circuit or bus communication circuit of module 410. After decoding and assigning the node address, auto addressing controller 214 controls the control signal at the control terminal of switch 302 to transition from a logic low to a logic high level, biasing switch 302 to conduct current. Auto addressing controller 214 enables repeater 216 and causes the control signal at the control terminal of switch 304 to bias switch 304 to disconnect output terminal 204 from ground. Auto addressing controller 214 re-generates the bit sequence with a new node address and provides it ("Code from Module 1") to a next module (during the second time period).

During the second time period, auto addressing controller 214 of the next module controls the control signal at the control terminal of switch 302 to turn off current flow through switch 302 and biases switch 304 to allow current flow through switch 304. During the second time period, auto addressing circuit 207 (or 407) decodes the bit sequence to recover the node address, assigns the node address, and then regenerates the bit sequence with a new address. Auto addressing controller 214 enables repeater 216 and switch 302 and disable switch 304 before transmitting the bit sequence to a next module and so on.

Thus, in the illustrated example, the modules in the daisy chain are addressed sequentially, with the previous module providing a node address for the next module. In an example, the auto addressing circuit 207 (or 407) generates the new address by adjusting the previous node address by a predetermined increment. In another example, the auto addressing circuit 207 (or 407) generates the new address by using a random bit sequence. In still another example, the auto addressing controller 214 controls switch 304 to toggle the voltage level at the output terminal 204, thereby adjusting the bit sequence, for example, to encode a new node address.

Figure 7:
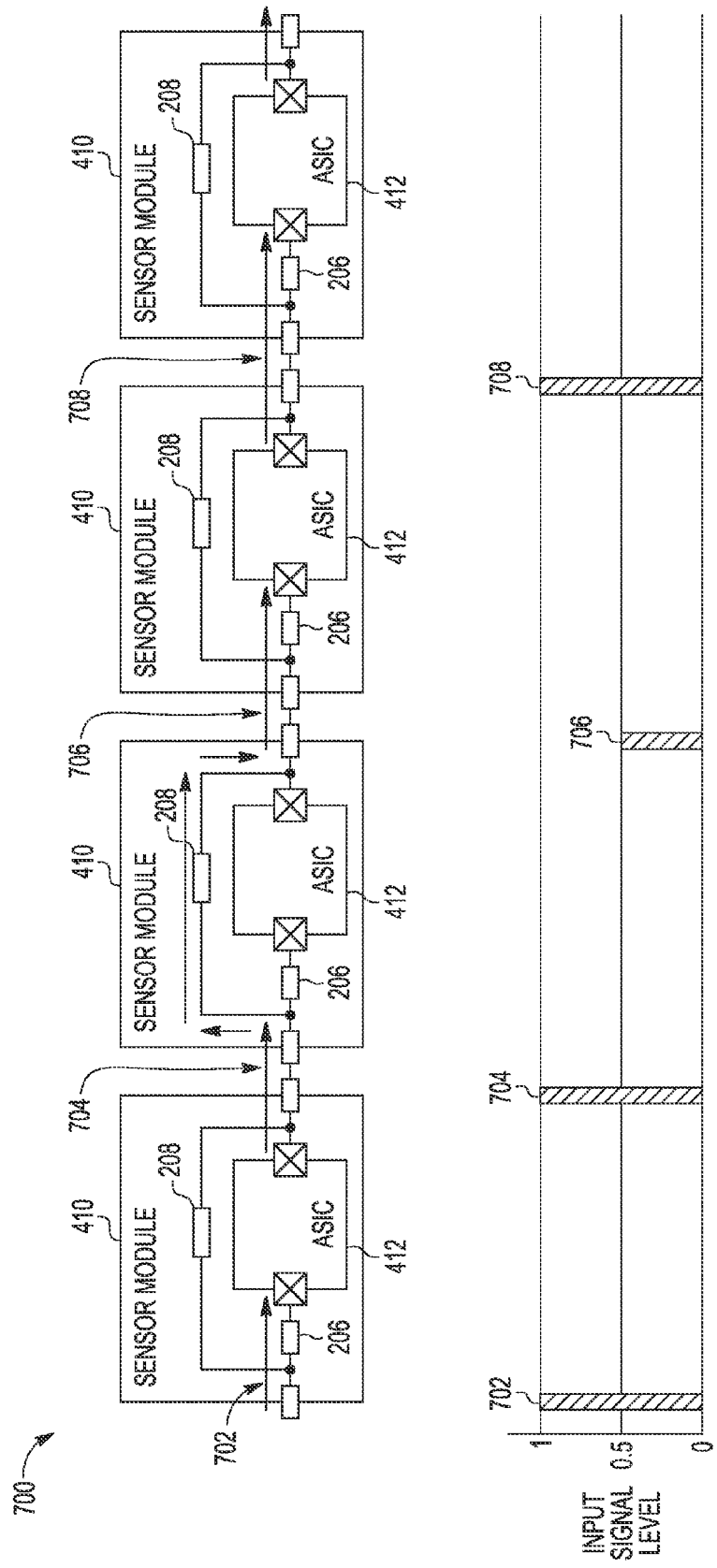
FIG. 7 is a partial block diagram of an embodiment of a daisy chain including a plurality of modules and depicting amplitudes of output signals at the outputs of each of the plurality of modules.

FIG. 7 is a diagram of an embodiment of a daisy chain 700 including a plurality of modules 410 and depicting amplitudes of output signals at the outputs of each of the plurality of modules. In this example, the first module receives a bit pattern 702, which is processed by auto addressing circuit 207 (or 407) of ASIC 212 (or 412), which forwards the bit pattern 704 to the next module 410. In this instance, ASIC 212 has failed. Bit pattern 704 flows through bypass resistor 208, and bit pattern 706 is provided to the next module 410. Auto addressing circuit 212 of the next module processes the bit pattern 706 and provides the processed bit pattern 708 to the next module, and so on.

Bit pattern 702 has an associated input signal level having a proportional signal level of approximately one, meaning that the input signal level substantially matches the original amplitude of the bit pattern provided by ECU 102. Bit pattern 704 also has a proportional signal level of approximately one, in part, because repeater 216 scales the bit pattern to restore the original signal strength. Between the second and third modules, however, the signal strength of bit pattern 706 is attenuated by bypass resistor 208, causing the amplitude to be proportionally reduced by approximately fifty percent. However, bit pattern 708 is returned to the original signal level by the repeater 216 within the third module 410.

In the illustrated example, in the case of some module failures, the bypass resistor 208 still allows the signal to reach next module without breaking the node address assignment signal process. Resistor 206 is optional to prevent the node address process from breaking in the event of a hard short on the input terminal. In an example, the signal level scalar of the first functional module can be understood by the following equation.

$$SC = \frac{1}{(N+1)} \quad (1)$$

In equation 1, the scalar (SC) is proportional to the number (N) of sequential failed scalars in front of the first functional one in the daisy chain 700. This scalar determines maximal number of sequentially failing modules in respect to the arbitrary comparator threshold level. Practically, Equation 1 suggests that the comparator threshold of comparator 411 should be configured for noise robustness and for overcoming a possible series of malfunctioned modules. As can be seen from Equation 1, auto addressing ASIC 212 can overcome several preceding failures without breaking the node address assignment process.

In conjunction with the systems, modules, and circuits described above, an electronic module includes a first configuration terminal, a second configuration terminal, a bus terminal, and a resistive element having a first terminal coupled to the first configuration terminal, and a second terminal coupled to the second configuration terminal. The electronic module further includes an auto addressing circuit coupled to the first and second configuration terminals, and responsive to a data pattern received at the first configuration terminal to assign a node address to an operational circuit, and subsequently to couple the first configuration terminal to the second configuration terminal. The operational circuit is subsequently responsive to the node address when the node address is received at the bus terminal.

Although the present invention has been described with reference to preferred embodiments, workers skilled in the art will recognize that changes may be made in form and detail without departing from the scope of the invention.

What is claimed is:

1. An integrated circuit comprising:
   a first configuration terminal;
   a second configuration terminal; and
   an auto addressing circuit coupled to the first and second configuration terminals, and responsive to a data pattern received at the first configuration terminal to assign a node address to an operational circuit, and subsequently to couple the first configuration terminal to the second configuration terminal, the auto addressing circuit comprising:
      a comparator including a first input coupled to the first configuration terminal, a second input for receiving a reference voltage, and an output;
      a repeater including an input coupled to the first configuration terminal, a control input, and an output coupled to the second configuration terminal; and
      an address assignment circuit including an input coupled to the output of the comparator and a control output coupled to the control input of the repeater, the address assignment circuit configured to disable the repeater in response to receiving the data pattern and to activate the repeater after assigning the node address,
   wherein the integrated circuit is subsequently responsive to the node address when the node address is received.

2. The integrated circuit of claim 1, wherein:
   the data pattern includes the node address; and
   the auto addressing circuit decodes the data pattern to determine and assign the node address.

3. The integrated circuit of claim 2, wherein the auto addressing circuit generates a second data pattern including a second node address and provides the second data pattern to the second configuration terminal.

4. The integrated circuit of claim 1, wherein the auto addressing circuit provides a control signal to the operational circuit having a bus terminal coupled to a bus, the control signal to enable the operational circuit to receive the node address from the bus terminal.

5. An integrated circuit comprising:
   a first configuration terminal;
   a second configuration terminal; and
   an auto addressing circuit coupled to the first and second configuration terminals, and responsive to a data pattern received at the first configuration terminal to assign a node address to an operational circuit, and subsequently to couple the first configuration terminal to the second configuration terminal, the auto addressing circuit comprising:
      a first comparator including a first input coupled to the first configuration terminal, a second input for receiving a first reference signal, and an output;
      a second comparator including a first input coupled to the first configuration terminal, a second input for receiving a second reference signal, and an output; and
      a repeater including an input coupled to the first configuration terminal, a control input, and an output coupled to the second configuration terminal; and
      an address assignment circuit including a first input coupled to the output of the first comparator, a second input coupled to the output of the second comparator, and a control output coupled to the control input of the repeater, the address assignment circuit configured to detect the data pattern using the first comparator and to detect a failed module based on a signal strength of the data pattern using the second comparator,
   wherein the integrated circuit is subsequently responsive to the node address when the node address is received.

6. An electronic module comprising:
   a first configuration terminal;
   a second configuration terminal;
   a bus terminal;
   a resistor having a first terminal coupled to the first configuration terminal, and a second terminal coupled to the second configuration terminal;
   an auto addressing circuit coupled to the first and second configuration terminals, and responsive to a data pattern received at the first configuration terminal to assign a node address to an operational circuit, and subsequently to couple the first configuration terminal to the second configuration terminal through a repeater, wherein the repeater restores a signal on the first configuration terminal to an original level; and
   the operational circuit is subsequently responsive to the node address when the node address is received at the bus terminal.

7. The electronic module of claim 6 wherein:
   the first and second configuration terminals, the bus terminal, the auto addressing circuit, and the operational circuit are combined on an integrated circuit; and
   the resistor is external to the integrated circuit.

8. The electronic module of claim 7 wherein the operational circuit comprises a sensor.

9. The electronic module of claim 6, wherein the operational circuit is coupled to the bus and is responsive to the auto addressing circuit to receive the node address at the bus terminal after the auto addressing circuit receives the data pattern.

10. The electronic module of claim 6, wherein the auto addressing circuit decodes the data pattern to determine the node address and assigns the node address to the operational circuit.

11. The electronic module of claim 6, wherein the auto addressing circuit regenerates the data pattern to include a new node address and provides the data pattern to the second configuration terminal.

12. The electronic module of claim 6, wherein the resistor provides the data pattern to the second configuration terminal when the auto addressing circuit fails.

13. The electronic module of claim 6, wherein the auto addressing circuit comprises:
   a comparator including a first input coupled to the first configuration terminal, a second input for receiving a reference voltage, and an output;

the repeater including an input coupled to the first configuration terminal, a control input, and an output coupled to the second configuration terminal; and an address assignment circuit including an input coupled to the output of the comparator and a control output coupled to the control input of the repeater, the address assignment circuit configured to disable the repeater in response to receiving the data pattern and to activate the repeater after assigning the node address.

14. The electronic module of claim 13, wherein:

the auto addressing circuit deactivates the repeater by connecting the output of the repeater to ground in response to the data pattern, and the auto addressing circuit activates the repeater by disconnecting the output of the repeater from ground after assigning the node address.

15. The electronic module of claim 6, wherein the auto addressing circuit comprises:

a first comparator including a first input coupled to the first configuration terminal, a second input for receiving a first reference signal, and an output;

a second comparator including a first input coupled to the first configuration terminal, a second input for receiving a second reference signal, and an output; and the repeater including an input coupled to the first configuration terminal, a control input, and an output coupled to the second configuration terminal; and an address assignment circuit including a first input coupled to the output of the first comparator, a second input coupled to the output of the second comparator, and a control output coupled to the control input of the repeater, the address assignment circuit configured to detect the data pattern using the first comparator and to detect a failed module based on a signal strength of the data pattern using the second comparator.

16. The electronic module of claim 6, wherein the resistor provides a bypass path for providing the data pattern to a next integrated circuit in a daisy chain configuration when the auto addressing circuit fails.

17. A circuit comprising:

a first configuration terminal configurable to receive a data pattern from one of an electronic control unit and a previous circuit of a plurality of electronic modules in a daisy-chain;

a second configuration terminal configurable to float or to couple to the first configuration terminal of a next electronic module of the plurality of electronic modules in the daisy-chain;

a bus terminal configurable to couple to a common bus;

a resistor including a first terminal coupled to the first configuration terminal and a second terminal coupled to the second configuration terminal for providing a first signal path; and an auto addressing circuit coupled to the first configuration terminal and the second configuration terminal, the auto addressing circuit configured to selectively provide a second signal path between the first configuration terminal and the second configuration terminal through a repeater, wherein the repeater restores a signal on the first configuration terminal to an original level, after receiving a node address at one of the first configuration terminal and the bus terminal.

18. The circuit of claim 17, wherein, in an active bus mode, a first electronic module of the plurality of electronic modules receives the data pattern, decodes the data pattern, and controls an operational circuit to receive the node address on the bus terminal.

19. The circuit of claim 17, wherein, in a passive bus mode, a first electronic module of the plurality of electronic modules receives the data pattern including a node address on the first configuration terminal, decodes the data pattern, and assigns the node address to an operational circuit.

* * * * *